United States Patent [19]
Kim

[11] Patent Number: 6,121,682
[45] Date of Patent: Sep. 19, 2000

[54] MULTI-CHIP PACKAGE

[75] Inventor: Jae Myun Kim, Kyoungki-do, Rep. of Korea

[73] Assignee: Hyundai Electronics Industries Co., Ltd., Kyoungki-do, Rep. of Korea

[21] Appl. No.: 09/469,131

[22] Filed: Dec. 21, 1999

[30] Foreign Application Priority Data

Dec. 26, 1998 [KR] Rep. of Korea ........................ 98-58915

[51] Int. Cl.⁷ .................................................. H01L 23/48
[52] U.S. Cl. .......................... 257/723; 257/724; 257/777; 257/778; 257/686
[58] Field of Search .................................... 257/723, 724, 257/777, 778, 686

[56] References Cited

U.S. PATENT DOCUMENTS

| | | | |
|---|---|---|---|
| 4,807,021 | 2/1989 | Okumura | 357/75 |
| 5,198,963 | 3/1993 | Gupta et al. | 257/737 |
| 5,508,556 | 4/1996 | Lin . | |
| 5,723,894 | 3/1998 | Ueno et al. . | |
| 5,734,199 | 3/1998 | Kawakita et al. | 257/737 |
| 5,760,478 | 6/1998 | Bozso et al. | 257/777 |
| 5,789,271 | 8/1998 | Akram . | |
| 5,789,278 | 8/1998 | Akram et al. . | |
| 5,801,452 | 9/1998 | Farnworth et al. . | |
| 5,808,360 | 9/1998 | Akram . | |
| 5,834,366 | 11/1998 | Akram . | |
| 5,854,507 | 12/1998 | Miremadi et al. | 257/686 |
| 5,861,678 | 1/1999 | Schrock . | |
| 5,869,894 | 2/1999 | Degani et al. | 257/723 |
| 5,898,223 | 4/1999 | Frye et al. | 257/777 |
| 5,939,783 | 8/1999 | Laine et al. | 257/778 |

Primary Examiner—David Hardy
Assistant Examiner—Lourdes Cruz
Attorney, Agent, or Firm—Selitto & Associates

[57] ABSTRACT

Disclosed is a multi-chip package. According to the present invention, a first semiconductor chip includes a first face in which a bonding pad disposed, and a second face opposite to the first face. A first insulating layer is coated over the first face of the first semiconductor chip so as to expose the bonding pad. A metal pattern is deposited on the first insulating layer and one end of the metal pattern is connected to the exposed bonding pad. A second insulating layer having a via hole exposing the metal pattern and a ball land, is coated over the first face of the first semiconductor chip. A second semiconductor chip includes a first face in which a bonding pad is disposed and opposite to the first face of the first semiconductor chip, and a second face opposite to the first face of the second semiconductor chip. The second semiconductor chip is opposed from the first face of the first semiconductor chip by a selected distance. A third insulating layer is coated on the first face of the second semiconduuctor chip so as to expose the bonding pad of the second semiconductor chip. A conductive bump is formed at the bonding pad of the second semiconductor chip. The conductive bump is inserted into the via hole, thereby electrically connecting the first and the second semiconductor chips with a medium of the metal pattern. A solder ball is mounted in the ball land, and the solder ball is formed with a size that is large enough to be protruded from the second face of the second semiconductor layer.

4 Claims, 4 Drawing Sheets

MULTI-CHIP PACKAGE

BACKGROUND OF THE INVENTION

1. Field of the Invention

This invention generally relates to a multi-chip package, and more particularly to a multi-chip package housing at least two chips within one package.

2. Description of the Related Art

For instance, a package used in a small camera such as digital camera and used in a charge coupled device(CCD), is constructed as a module including an image sensing chip and other peripheral chips for driving the image sensing chip.

FIG. 1 is a cross-sectional view showing a conventional multi-chip package. As shown in the drawing, two semiconductor chips 2 are attached on a substrate 1. The respective bonding pads of the semiconductor chips 2 are electrically connected to the substrate 1 through metal wires 3. The entire upper portion of resultant is encapsulated with a molding compound 4. A plurality of solder balls 5 are mounted on a lower portion of the substrate 1.

In the meantime, the conventional multi-chip package incurs following problems.

First, the substrate must have large size size the respective semiconductor chips are disposed horizontally on the substrate in a line. Therefore, the size of the package is increased as the number of the semiconductor chips is increased.

There is also occurred a considerable amount of inductance component in a long metal wire since the substrate and the bonding pads of the semiconductor chips are connected by metal wires. As a result, the electric property is degraded due to the inductance component.

Furthermore, the structural reliability of the package is degraded since the molding compound and the substrate have different coefficients of thermal expansion. Also, the semiconductor chips are completely surrounded by the molding compound, therefore heat-dissipating function in the package is not utilized actively.

SUMMARY OF THE INVENTION

Accordingly, the present invention is directed to solve foregoing problems caused by the conventional multi-chip package, and this invention provides a multi-chip package having its size as large as a semiconductor chip.

It is another object of the present invention to improve the electric characteristic by excluding the metal wires and then by reducing the inductance component.

It is yet another object of the present invention to solve the structural deterioration problem originated from the difference of thermal expansion by excluding the substrate and the molding compound.

To accomplish said objects of the present invention, the multi-chip package according to this invention comprises as follows.

A first semiconductor chip includes a first face on which a bonding pad disposed, and a second face opposite to the first face. A first insulating layer is coated over the first face of the first semiconductor chip so as to expose the bonding pad. A metal pattern is deposited on the first insulating layer and one end of the metal pattern is connected to the exposed bonding pad. A second insulating layer having a via hole exposing the metal pattern and a ball land, is coated over the first face of the first semiconductor chip.

A second semiconductor chip includes a first face on which a bonding pad is disposed and opposite to the first face of the first semiconductor chip, and a second face opposite to the first face of the second semiconductor chip. The second semiconductor chip is disposed from the first face of the first semiconductor chip by a selected distance. A third insulating layer is coated on the first face of the second semiconductor chip so as to expose the bonding pad of the second semiconductor chip. A conductive bump is formed at the bonding pad of the second semiconductor chip. The conductive bump is inserted into the via hole, thereby electrically connecting the first and the second semiconductor chips with a medium of the metal pattern. A solder ball is mounted in the ball land, and the solder ball is formed with a size that is enough to be protruded from the second face of the second semiconductor layer.

According to the constitutions of the present invention, the multi-chip package can have a size as large as one semiconductor chip since two semiconductor chips are stacked up and down. Further, the electric characteristic of the package is improved since the conductive bump is used instead of the metal wire. The structural deterioration problem due to the difference of the coefficient of thermal expansion between the substrate and the molding compound, is completely solved since no substrate and molding compound is used in the present package. Also, the first and the second semiconductor chips are exposed to outside respectively, excellent heat-dissipating operation is performed.

DETAILED DESCRIPTION OF THE PREFERRED EMBODIMENT

Figure 1:
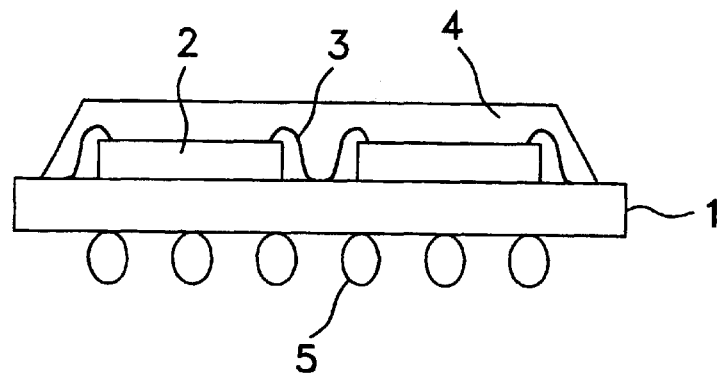
FIG. 1 is a cross-sectional view showing a conventional multi-chip package.
Figure 2:
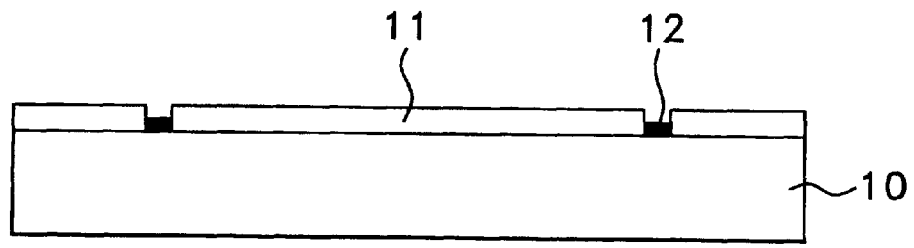
FIGS. 2 to 9 are procedural cross-sectional views showing a method for forming a multi-chip package according to the present invention.
Figure 3:
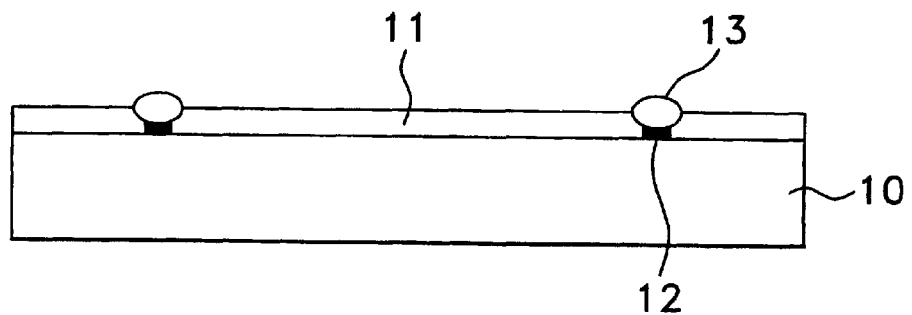

Referring to FIG. 2, a second semiconductor chip 10 includes a first face and a second face opposite to the first face. A bonding pad 12 of the second semiconductor chip 10 is disposed on the fist face. A third insulating layer 11 is coated over the first face of the second semiconductor chip 10 by thickness of 1~50 μm. And then, a selected portion of the third insulating layer 11 is etched so as to expose the bonding pad 12. As shown in FIG. 3, a conductive metal bump 13 is formed at the exposed bonding pad 12. Especially, an alloy selected from a group consisting of Cu/Ni/Au, Cu/Ni/Cr/Au, Cu/Ni/Co/Au, Cu/Ni/Au/Sn, Cu/Ni/Cr/Au/Sn and Cu/Ni/Co/Au/Sn, is preferably plated at the bonding pad 12 in order to intensify adhesion property between the bonding pad 12 and the metal bump 13.

Figure 4:
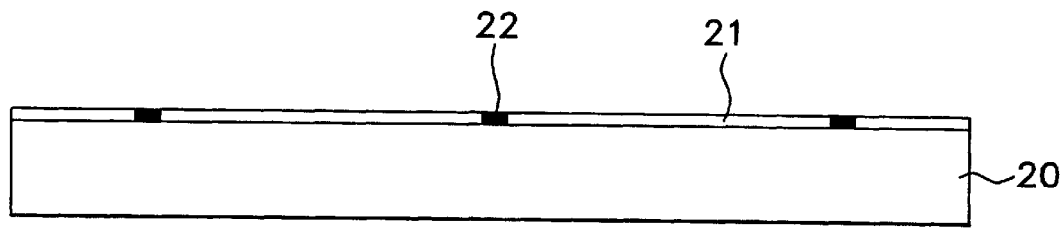

Meanwhile, as shown in FIG. 4, a first insulating layer 21 is coated over an entire surface of a wafer in which a plurality of first semiconductor chips 20 are formed. Accordingly, the first semiconductor chip 20 includes a first face and a second face opposite to the first face. A bonding pad 22 of the first semiconductor chip 20 is disposed on the first face of the first semiconductor chip 20. A selected portion of the first insulating layer 21 is etched so as to expose the bonding pad 22 of the first semiconductor chip 20.

Figure 5A:
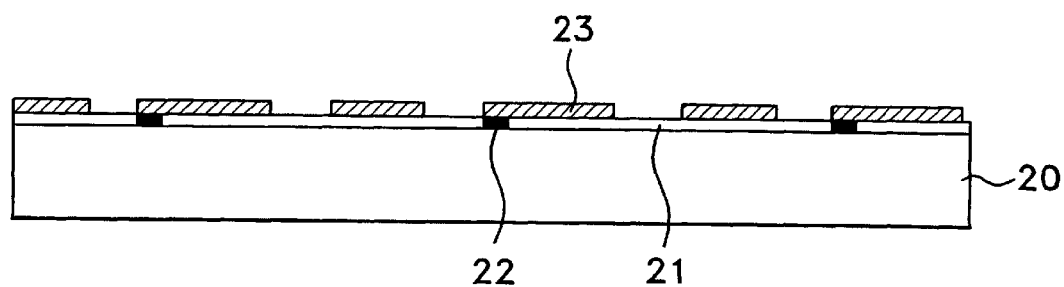
Figure 5B:
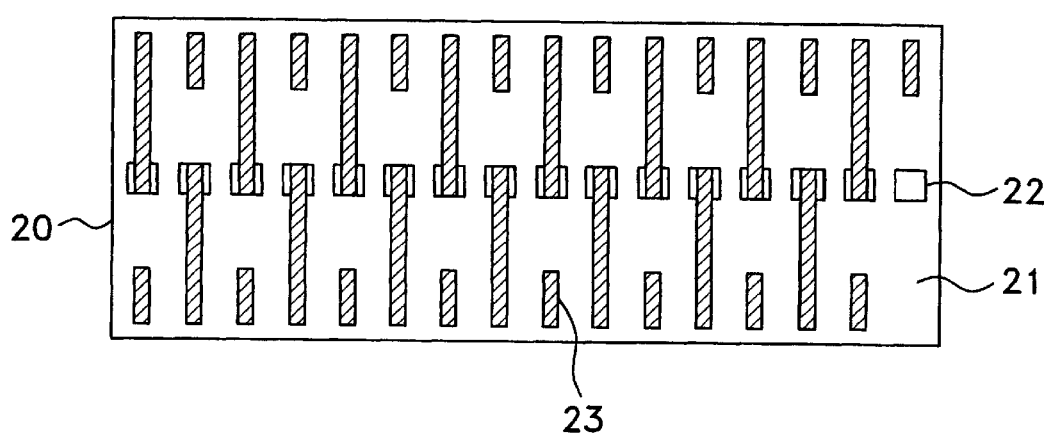

Afterward, as shown in Figs. 5A and 5B, a plurality of metal patterns 23 are deposited on the first insulating layer 21, thereby electrically connecting the respective one ends of the metal patterns 23 to the bonding pad 22 of the first semiconductor chip 20. The metal pattern can be made of one selected from Ag, Au, Ni, In, and Sn.

Figure 6:
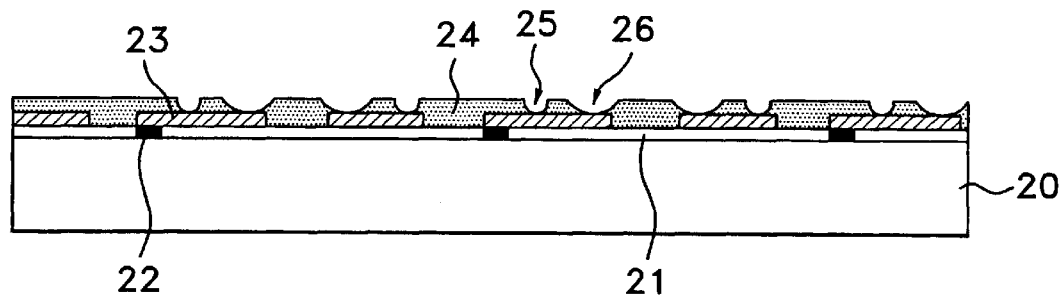

Next, as shown in FIG. 6, a second insulating layer 24 is coated over the entire resultant on the wafer, and a selected portion of the second insulating layer 24 is etched so as to expose two portions per one metal pattern 23. One of the exposed two portions of the metal pattern 23 adjacent to the bonding pad, becomes a via hole 25 and the other portion becomes a ball land 26. Herein, the respective insulating layers 11,21,24 are made of a material having equal coefficient of thermal expansion.

Figure 7:
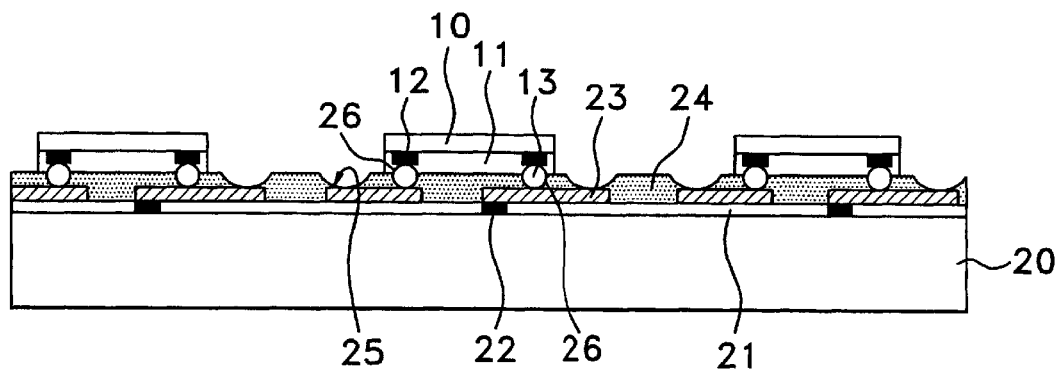

Afterward, the plurality of second semiconductor chips 10 as constituted above are attached to the first semiconductor chip 20 by overturning the second semiconductor chips 10 as shown in FIG. 7. Namely, the metal bump 13 and the metal pattern 23 are electrically connected by inserting the metal bump 13 into the via hole 25. Accordingly, the first and the second semiconductor chips 20,10 are electrically connected to each other by the mediums of the metal bump 13 and the metal pattern 23. Herein, the size of the second semiconductor chip 10 is large enough to expose the ball lands 26 of both sides of the second semiconductor chip 10.

Figure 8:
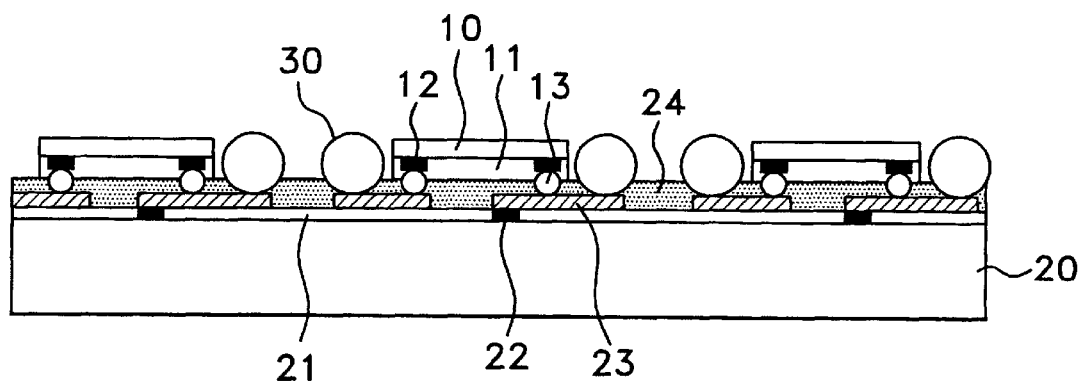

And then, as shown in FIG. 8, solder balls 30 are mounted at the ball lands 26 disposed at both sides of the second semiconductor chip 10. Herein, the solder balls 30 must be positioned higher than the second face of the second semiconductor chip 10, so that they can be mounted on a substrate. As a result, since a diameter of the solder ball 30 is generally 250~700 μm, the thickness of the second semiconductor chip 10 is limited within 50~500 μm.

Figure 9:
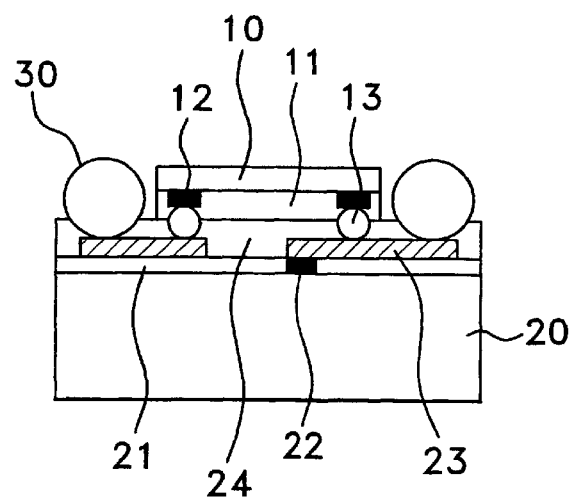

Finally, the wafer is cut off along a scribe line formed on the wafer, thereby achieving a multi-chip package as shown in FIG. 9.

As disclosed in the above specification, the size of the multi-chip package is equal to that of the semiconductor chip by depositing two substrates rather than using substrates.

Further, the electric characteristic of the package is improved since the conductive bump is used instead of the metal wire.

The structural deterioration problem due to the difference of the coefficient of thermal expansion between the substrate and the molding compound, is completely solved. Also, the semiconductor chips are exposed to outside respectively, excellent heat-dissipating operation is performed.

While the present invention has been described with reference to certain preferred embodiment of a multi-chip package, various other modifications will be apparent to and can be readily made by those skilled in the art without departing from the scope and spirit of the present invention.

What is claimed is:

1. A multi-chip package comprising:

a first semiconductor chip comprising a first face in which a bonding pad disposed, and a second face opposite to the first face;

a first insulating layer coated over the first face of the first semiconductor chip so as to expose the bonding pad of the first semiconductor chip;

a metal pattern deposited on the first insulating layer and electrically connected to the bonding pad of the first semiconductor chip;

a second insulating layer coated over the first semiconductor chip, and having a via hole and a ball land which expose two portions of the metal pattern;

a second semiconductor chip comprising a first face in which a bonding pad is disposed and opposite to the first face of the first semiconductor chip, and a second face opposite to the first face of the second conductor chip, wherein the first face of the second semiconductor chip is opposed from the first face of the first semiconductor chip by a selected distance;

a third insulating layer coated on the first face of the second semiconductor chip so as to expose the bonding pad of the second semiconductor chip;

a conductive bump formed at the bounding pad of the second semiconductor chip, and inserted into the via hole thereby electrically connecting to the metal pattern; and a solder ball is mounted in the ball land, and formed with a size that is large enough to be protruded from the second face of the second semiconductor chip.

2. The multi-chip package of claim 1, wherein the respective insulating layers have an equal coefficient of thermal expansion.

3. The multi-chip package of claim 1, wherein an alloy selected from a group consisting of Cu/Ni/Au, Cu/Ni/Cr/Au, Cu/Ni/Co/Au, Cu/Ni/Au/Sn, Cu/Ni/Cr/Au/Sn and Cu/Ni/Co/Au/Sn, is plated at the bonding pads of the first and the second semiconductor chips.

4. The multi-chip package of claim 1, wherein the metal pattern is made of a material selected from Ag, Au, Ni, In and Sn.

* * * * *

UNITED STATES PATENT AND TRADEMARK OFFICE
CERTIFICATE OF CORRECTION

PATENT NO.     : 6,121,682                                      Page 1 of 1
DATED          : September 19, 2000
INVENTOR(S)    : Jae Myun Kim It is certified that error appears in the above-identified patent and that said Letters Patent is hereby corrected as shown below:

Column 2,
Line 44, delete "fist" and insert -- first --; and
Line 65, delete "SA" and insert -- "5A" --.

Signed and Sealed this

Fourth Day of November, 2003

JAMES E. ROGAN
*Director of the United States Patent and Trademark Office*